March 5, 1968 D. HAFLER 3,372,344

TRANSISTOR AMPLIFIER PROTECTIVE CIRCUIT

Filed Oct. 20, 1965

INVENTOR
DAVID HAFLER

BY Hurvitz & Rose

ATTORNEYS 3,372,344

TRANSISTOR AMPLIFIER PROTECTIVE CIRCUIT

David Hafler, 11 Merion Road,
Merion Station, Pa. 19066

Filed Oct. 20, 1965, Ser. No. 498,570
5 Claims. (Cl. 330—17)

Figure 1:
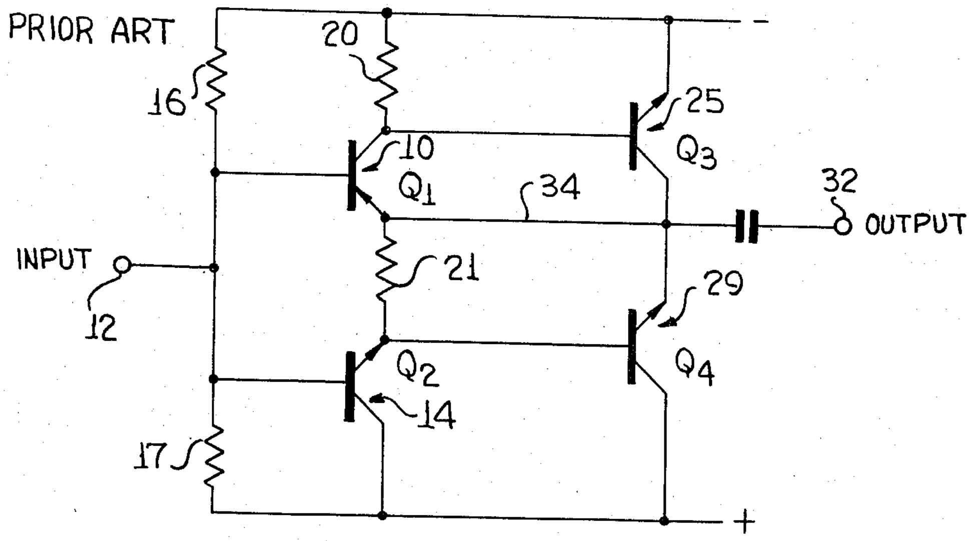

The present invention relates generally to protective circuits for transistor amplifiers and more particularly to a combined current limiting and biasing network, especially suitable for use in audio circuits which employ a complementary-symmetry phase inverter stage coupled to series connected or complementary-symmetry output stages.

The advantages of transistorized phase inverting networks in the output circuitry of audio amplifiers are to some extent counteracted by the increased vulnerability of the transistors in that configuration to overload currents. The present invention provides a simple network which may be incorporated in the emitter circuit of the phase inverter to function as a current limiting device and at the same time as a variable biasing arrangement to provide distortion-free signal translation at low signal levels.

In a conventional arrangement the audio output is taken from the junction of a pair of series-connected or complementary-symmetry output transistors which are driven by balanced signals deriving from respective transistors of a complementary-symmetry phase inverter. The input signal from the preceding stages of the circuit is applied via a voltage divider to the input electrodes of the phase inverter transistors. At least one output transistor and the associated transistor of the phase inverter are coupled in a negative feedback loop which tends to correct for any DC shifts at the junction of the output transistors relative to the DC reference point at the input junction of the phase inverter transistors. The feedback loop renders the transistors particularly susceptible to heavy currents resulting from an overload condition since each complementary transistor of the phase inverter must supply its respective output transistor with continually increasing current to maintain the input-output relationship. This situation leads rather rapidly to transistor self-destruction.

Briefly, in accordance with the present invention, the reversible conduction characteristics of a forward biased conventional semiconducting junction diode are used to advantage by connecting the diode in the emitter circuit of one transistor of the phase inverter. The diode is biased to conduction to permit passage of emitter bleed current in the forward direction and feedback current in the reverse direction. When these two currents are equal, depending upon the component values and characteristics, the diode is rendered non-conductive and the feedback loop is opened.

Another feature of the present invention is that the diode and associated biasing components function also as a variable biasing network for the amplifier. At low signal levels the voltage drop across the diode lowers the voltage at the emitter electrode of the associated transistor relative to its base to maintain the latter conductive at low signal levels which, in turn, makes the output transistors conductive. In the absence of such biasing, low level signals are distorted because of the notch in the transfer characteristics of the transistor at low signal levels. On the other hand, at high current levels the voltage drop across the diode approaches zero so that the emitter biasing is removed. Since the special biasing is not normally required at high current levels there is no increase in signal distortion over that which is otherwise attributable to the signal translation characteristic of the amplifier. In addition, since the amount of power dissipation caused by the biasing arrangement is practically negligible at the high levels the output can be driven at proportionately increased levels before maximum dissipation occurs.

It is accordingly a primary object of the present invention to provide a novel protective circuit for transistor amplifiers.

It is a more specific object of the present invention to provide a novel combined protective circuit and biasing arrangement for audio amplifiers which includes a phase inverter of the complementary-symmetry type coupled to series connected or complementary-symmetry output stages.

Figure 2:
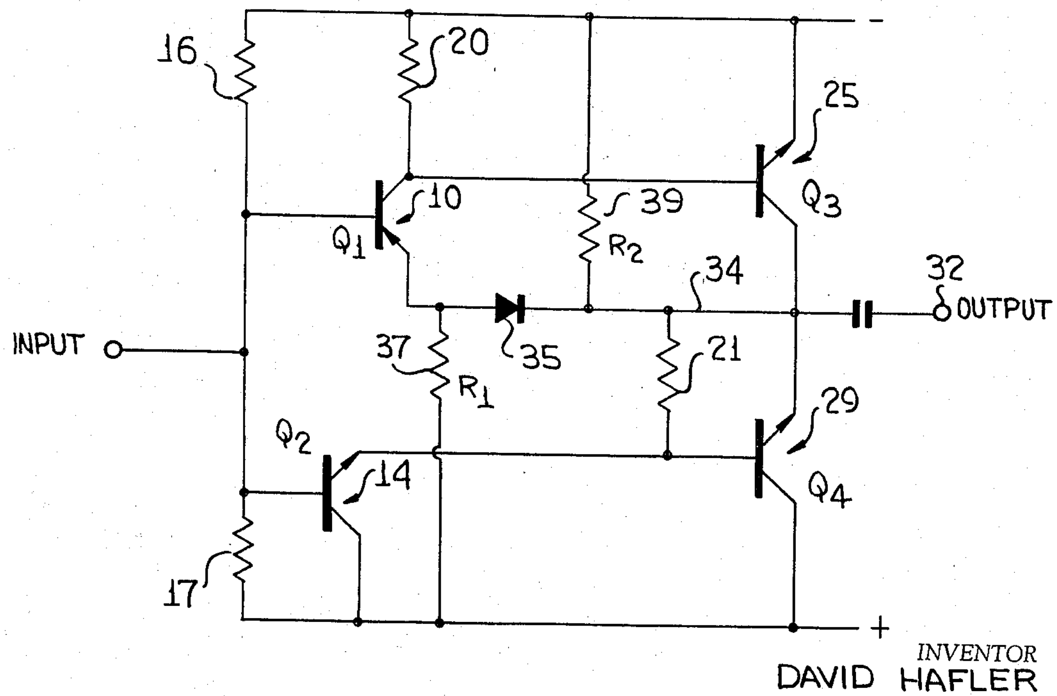

The above and still further objects, features and attendant advantages of the present invention will become apparent from a consideration of the following detailed description of a specific embodiment thereof, especially when taken in conjunction with the accompanying drawings, in which:

FIGURE 1 is a circuit diagram of a typical prior art phase inverting complementary-symmetry transistor amplifier coupled to series connected output stage transistors; and FIGURE 2 is a circuit diagram corresponding to that of FIGURE 1 and including a protective biasing network in accordance with the present invention.

Referring now to the drawings, wherein like reference numerals refer to like components in the two figures, the prior art circuit includes an input terminal 12 connected to the junction of a pair of voltage dividing resistors 16 and 17 coupled across the circuit power supply. Input terminal 12 may, for example, be direct coupled or capacitively coupled to previous stages of the audio circuit for receiving input signal therefrom. In a direct coupled arrangement, terminal 12 is either emitter or collector of a driving transistor which replaces either resistor 16 or resistor 17.

A pair of complementary-symmetry transistors 10, 14 are connected for parallel application of the input signal appearing at terminal 12 to their respective base electrodes connected to the junction of the voltage dividing resistors 16 and 17. Forward bias is applied by the drop through 35 (which may be a diode and/or resistor). In the illustrative embodiment transistor 10 is of the PNP type while transistor 14 is of the NPN type, i.e., opposite conductivity types, the two forming, along with associated biasing components, a conventional complementary-symmetry phase inverter. Oppositely phased output signals are taken respectively from the junction of the collector electrode of transistor 10 and load resistor 20 and from the junction of the emitter electrode of transistor 14 and load resistor 21. The out-of-phase signals are applied to respective output stage transistors 25 and 29 which are series-connected across the circuit power supply. In the illustrative embodiment transistors 25 and 29 are each of the NPN type having their respective input electrodes direct coupled to the output electrodes of the phase inverter transistors. The output stage may alternatively comprise complementary symmetry transistors with connection from output collectors to input emitters, without affecting the essence of the invention.

In the typical prior art circuit shown in FIGURE 1 the output current passes through both output transistors 25 and 29, each of which conducts alternately in class B mode in unison with its respective phase inverter transistors. Output signal is taken from output terminal 32, capacitively coupled to the junction between the ouput transistors. The latter junction is directly connected via path 34 to the junction of the emitter electrode of transistor 10 and the load resistor 21 of transistor 14, so that transistors 10 and 25 are arranged in a complementary connection with feedback from the collector electrode of transistor 25 to the emitter electrode of transistor 10. In operation, transistors 10 and 14 conduct alternately in class B mode, in response to an alternating signal applied at terminal 12, and supply oppositely phased signals to the respective direct coupled output stage transistors 25 and 29. A portion of the output current flowing through the latter is fed back via conductive path 34 to the emitter of transistor 10. Since the base of transistor 10 (and similarly the base of transistor 14) is referenced for direct current by the voltage dividing resistors 16 and 17 across the power supply, and DC shifts relative to that reference point which may occur at the junction of transistors 25 and 29 tend to be corrected by the current through the latter transistors, a portion of that current being fed back to transistor 10. If the output of the amplifier is heavily loaded, by the shorting of loudspeaker leads (not shown) connected to the output terminal 32, for example, transistor 10 must supply increased current to transistor 25 in order to maintain the DC relationship between input junction and output junction. This results in an increased current through both output transistors 25 and 29 and will, if not immediately corrected, result in failure of those transistors.

Since the same output current flows through both of transistors 25 and 29, if one is rendered non-conductive current flow through both will cease. This fact makes possible the utilization of a simple, yet effective, protective network which is operative to limit the output current flowing through transistors 25 and 29 by opening the feedback loop under overload conditions. Such a protective network, in accordance with the present invention is shown in the circuit of FIGURE 2.

Referring now to FIGURE 2, it will readily be observed that this circuit differs from the circuit of FIGURE 1 only in the connection of diode 35 in the emitter circuit of transistor 10, the anode of the diode being connected to the emitter electrode of the transistor, and a pair of resistors 37 and 39 connected respectively from opposite electrodes of the diode to opposite polarity terminals of the circuit power supply to provide the desired diode forward bias. In the event of overloading, transistor 10 is required to supply increased current to transistor 25 to maintain the input-output relationship, as previously discussed. This added current flows through resistor 37 and a portion flows through the branch containing diode 35 and resistor 39 in the forward direction through the diode. Conventional diode 35 is also operative to permit passage of feedback current in the reverse direction from transistor 25 to transistor 10 as long as the diode remains forward biased. When the current flow through the path including the circuit power supply, resistor 37, diode 35, and resistor 39 equals the oppositely flowing current in feedback path 24, the diode is rendered non-conductive, i.e., the forward bias is effectively removed, and the feedback path is opened. There is no longer a demand on transistor 10 to supply added current and the current flow through transistors 25 and 29 is effectively limited.

In this manner the protective circuit, according to the present invention, may be employed to maintain the transistors currents within the maximum rated limit of the particular transistors employed. An additional advantage of the protective network is its biasing effect on transistor 10. At low signal levels, and hence low current levels, the voltage drop across diode 35 reduces the voltage at the emitter electrode of transistor 10 relative to its base electrode potential. Consequently, transistor 10 and consequently transistors 25 and 29 are biased to a conductive state to permit distortion-free low-level signal translation. Without such bias the transistors' transfer characteristic exhibits a non-linear notch at low signal levels, that is, the transistor is virtually non-conductive at the low signal levels, resulting in signal distortion at the output of the overall amplifier. Optimum bias may require several diodes in series or combination of diodes and resistors, and the protective feature remains operative.

The protective network does not affect high signal level translation, since as diode 35 approaches non-conduction upon occurrence of the accompanying high current levels, as previously described, the voltage drop across the diode is practically negligible and the biasing effect of the protective network is removed. This is advantageous since such bias is not required at the higher current levels and if present would result in signal distortion. For the range between the low and the high signal levels, the diode exhibits a variable substantially linear biasing effect. With the described biasing arrangement the amount of power dissipation attributable to biasing is substantially reduced at the higher current levels so that the output of the overall amplifier circuit may be driven at increased levels before maximum allowable dissipation is reached.

The conventional prior art biasing arrangement employed to effect distortion-free level signal transfer comprises a series arrangement of resistors and diodes connected between the base electrodes of the two transistors of the phase inverter. It will be recognized by those skilled in the art, however, that impedances in the base circuit of the transistors often results in thermal instability, a condition which is avoided in the present invention by the use of the diode as a bias element in the emitter circuit.

Various modifications of my invention will become apparent to those skilled in the art from a consideration of the foregoing description. For example, the single diode may be replaced by several diodes or by a combination of one or more diodes and resistors to provide the described functions. Thus, while I have described a particular embodiment of my invention, various changes and modifications in the particular details of construction shown and described may be resorted to without departing from the true spirit and scope of the invention as defined by the appended claims.

I claim:

1. A current limited transistor amplifier comprising a pair of complementary-symmetry transistors each having an input electrode, an output electrode and an electrode common to input and output; means connecting the input electrodes of said transistors for simultaneous application of input signal thereto; means coupling said transistors across a DC power supply in phase inverting relationship to provide oppositely phased output signals at said output electrodes thereof; a further pair of transistors connected across said power supply in common signal current conducting relationship, each of the last-named transistors having an input electrode, an output electrode and an electrode common to both input and output; a signal output terminal connected to the junction between said last-named transistors; means respectively connecting the output electrode of each of the first-named transistors to the input electrode of each of said last-named transistors; means including at least one semi-conductor junction diode connecting said output terminal junction to the common electrode of one of said first-named transistors to provide a current feedback path therebetween; and means for biasing said diode to limit the feedback current therethrough to a predetermined maximum level.

2. The combination according to claim 1 wherein said means for biasing includes a pair of resistors respectively connected from opposite electrodes of said diode to opposite polarity terminals of said power supply so as to conduct current through said diode in a direction opposite that of the feedback current through said diode.

3. A transistor amplifier circuit comprising a driver stage including first and second transistors of opposite conductivity type couples to provide oppositely phased output signals therefrom in response to simultaneous application of input signal thereto; an output stage including first and second transistors coupled to receive respective output signals from said first and second transistors of said driver stage; means connecting the output circuits of the driver stage transistors to a first common junction; means connecting the output circuits of the output stage transistors to a second common junction for deriving output signal therefrom; a negative feedback path connecting said first and second common junctions; and means in said negative feedback path for limiting the flow of feedback current to a predetermined maximum level and for variably biasing said driver stage to maintain signal conduction at low signal levels.

4. The combination according to claim 3 wherein said current limiting and variable biasing means includes a semiconductor junction diode.

5. A transistor amplifier circuit comprising a phase inverter stage and an output stage, said phase inverter stage including a first transistor of one conductivity type having emitter, base and collector electrodes, a second transistor of opposite conductivity type having emitter, base and collector electrodes, means connecting said transistors in series with a direct current supply source, means connecting the base electrodes of said transistors in parallel for application of input signal thereto; said output stage including first and second transistors each having emitter, base and collector electrodes, means connecting the last-named transistors in series with said direct current supply source, means for applying the oppositely phased output signals of said phase inverter stage to respective ones of the base electrodes of the output stage transistors; a negative feedback path connected from said output stage to said phase inverter stage; and biased semiconducting junction diode means connected in said feedback path for limiting the feedback current from said output stage to said phase inverter stage to a predetermined maximum level.

References Cited

UNITED STATES PATENTS 3,233,115 2/1966 Chou ------------- 330—15 X

ROY LAKE, *Primary Examiner.*

J. B. MULLINS, *Assistant Examiner.*